(12) United States Patent
Park et al.

(10) Patent No.: US 9,825,151 B2
(45) Date of Patent: Nov. 21, 2017

(54) METHOD FOR PREPARING SUBSTRATE USING GERMANIUM CONDENSATION PROCESS AND METHOD FOR MANUFACTURING SEMICONDUCTOR DEVICE USING SAME

(71) Applicant: IUCF-HYU, Seoul (KR)

(72) Inventors: Jea Gun Park, Seongnam-Si (KR); Tea Hun Shim, Suwon-Si (KR); Seung Hyun Song, Seoul (KR); Du Yeong Lee, Seoul (KR)

(73) Assignee: IUCF-HYU (KR)

( * ) Notice: Subject to any disclaimer, the term of this patent is extended or adjusted under 35 U.S.C. 154(b) by 0 days.

(21) Appl. No.: 15/115,262

(22) PCT Filed: Jan. 27, 2015

(86) PCT No.: PCT/KR2015/000829
§ 371 (c)(1),
(2) Date: Jul. 28, 2016

(87) PCT Pub. No.: WO2015/115769
PCT Pub. Date: Aug. 6, 2015

(65) Prior Publication Data
US 2017/0012113 A1    Jan. 12, 2017

(30) Foreign Application Priority Data

Jan. 28, 2014 (KR) .................. 10-2014-0010290

(51) Int. Cl.
*H01L 29/66* (2006.01)
*H01L 21/02* (2006.01)
(Continued)

(52) U.S. Cl.
CPC .... *H01L 29/66795* (2013.01); *H01L 21/0245* (2013.01); *H01L 21/02236* (2013.01);
(Continued)

(58) Field of Classification Search
CPC .................................. H01L 21/02532
See application file for complete search history.

(56) References Cited

U.S. PATENT DOCUMENTS

| 7,427,779 B2 * | 9/2008 | Damlencourt ...... H01L 21/7624 257/19 |
| 8,877,608 B2 * | 11/2014 | Di ..................... H01L 21/76254 438/458 |
| 9,324,801 B2 * | 4/2016 | Lauer ................. H01L 29/1054 |

FOREIGN PATENT DOCUMENTS

| JP | 2004363199 A | 12/2004 |
| JP | 2008532276 A | 8/2008 |

(Continued)

OTHER PUBLICATIONS

International Search Report and Written Opinion of PCT/KR2015/000829 dated Apr. 29, 2015.

*Primary Examiner* — Yu-Hsi D Sun
(74) *Attorney, Agent, or Firm* — Renaissance IP Law Group LLP

(57) ABSTRACT

The present invention suggests a substrate manufacturing method and a manufacturing method of a semiconductor device comprising: providing a SOI structure having an insulation layer and a silicon layer laminated on a substrate; laminating to form a silicon germanium layer and a capping silicon layer on the SOI structure; implementing oxidation process at two or more temperatures and heat treatment process at least once during the oxidation process to form a germanium cohesion layer and a silicon dioxide layer; and removing the silicon dioxide layer.

14 Claims, 15 Drawing Sheets

(51) Int. Cl.
   *H01L 29/78* (2006.01)
   *H01L 21/225* (2006.01)
   *H01L 29/16* (2006.01)

(52) U.S. Cl.
   CPC .. *H01L 21/02238* (2013.01); *H01L 21/02255* (2013.01); *H01L 21/02381* (2013.01); *H01L 21/02488* (2013.01); *H01L 21/02532* (2013.01); *H01L 21/02587* (2013.01); *H01L 21/02664* (2013.01); *H01L 21/2257* (2013.01); *H01L 29/16* (2013.01); *H01L 29/785* (2013.01); *H01L 29/7854* (2013.01)

(56) References Cited

FOREIGN PATENT DOCUMENTS

| KR | 20060103190 A | 9/2006 |
|---|---|---|
| KR | 20100096480 A | 9/2010 |

\* cited by examiner

METHOD FOR PREPARING SUBSTRATE USING GERMANIUM CONDENSATION PROCESS AND METHOD FOR MANUFACTURING SEMICONDUCTOR DEVICE USING SAME

TECHNICAL FIELD

The present invention disclosed herein relates to a substrate manufacturing method, and more particularly, to a substrate manufacturing method for high-performance device using germanium condensation process.

BACKGROUND ART

As the design rule for a metal oxide semiconductor field effect transistor (MOSFET) gets reduced gradually, various problems such as short channel effect, drain induced barrier lowering (DIBL), and gate induced drain leakage (GIDL) occur. As a material for usage of channel to overcome these problems, compounds in III-V family and germanium (Ge) are rising in substitution for silicon. A compound semiconductor of III-V family is attracting attention as a channel material of n-MOSFET because of its high electron mobility, and Ge is attracting attention as a channel material of p-MOSFET because of its highest hole mobility. And in structural aspect, a partially depleted SOI structure and a fully depleted SOI structure based on silicon on insulator (SOI) substrate are in the limelight as structures to substitute conventional MOSFET of planar structure.

A Ge substrate may be used to use Ge as a channel material. A method of growing Ge on a silicon substrate is used since a Ge substrate is in very high price. However, direct growing Ge on a silicon substrate may cause a threading dislocation by a big difference of lattice constant between Si and Ge. Hence, a method is known that reduce the dislocation by forming silicon germanium (Si—Ge) layer with concentration escalation from Ge of low concentration to Ge of high concentration in a thickness of several micrometers on a silicon substrate and then form Ge of high concentration on the most upper portion. However, there exists a critical thickness in Si—Ge layer at which a dislocation does occur when the Si—Ge layer deposition is made on Si by Ge concentration. Therefore, The Si—Ge layer is formed thick to form Ge without final dislocation. So, formation of thick Si—Ge layer in this method cause a problem of high price despite a price merit compared to Ge substrate.

Meanwhile, forming a Si—Ge having Ge of low concentration at which a threading dislocation does not occur on a SOI substrate and getting it in oxidation at a certain temperature may cause Si atom to get a reaction with O atom to form a silicon dioxide ($SiO_2$) layer with Ge concentration getting higher in a Si—Ge layer that gets thinner. Therefore, a germanium on insulator (GeOI) substrate may be formed having Ge concentration of 100% with sufficient oxidation. A process containing such a oxidation process is called as a germanium condensation process. A manufacturing process of GeOI substrate using the germanium condensation process has a merit of low cost and short process time.

However, in a conventional germanium condensation process, the process goes by implementing oxidation process and deposition of Si—Ge layer on a SOI substrate at a single temperature. Therefore, a problem of declination in concentration uniformity and surface roughness occurs. That is to say, a conventional condensation process is implemented at a temperature of generally higher than or equal to 1000° C. after deposition of a Si—Ge layer with Ge concentration of less than or equal to 30 at % on a SOI substrate. However, melting point gets lower as Ge concentration gets higher which cause the Si—Ge layer to get into liquid state, not solid, to make the concentration uniformity and surface roughness, etc. of the Si—Ge layer severely bad. And, conventional condensation method proceeds oxidation process after the deposition of the Si—Ge layer on the SOI substrate, and both of Si atom and Ge atom exist on the surface where the oxidation starts, which cause the oxygen to react with the Si atom in advance than the Ge atom. Therefore, uniform oxidation on entire surface of the substrate is not produced to make a problem of largely increased surface roughness.

As a method to solve such a problem, implementing oxidation process at two temperatures is proposed in JP2004-363199A. This technology may solve the surface roughness problem occurring during a condensation process. However, continuing condensation process to get higher Ge concentration may make uniformity of Ge concentration fall in a vertical direction of substrate. That is to say, the surface makes oxidation reaction with oxygen first, and Ge concentration gets gradually higher from the surface of the oxidation film. This phenomenon cause generation of stepwise concentration difference. When a difference of concentration occurs in stepwise way, physical characteristic and electrical characteristic may be changed by depth, which requires an even concentration distribution.

RELATED ART DOCUMENT

JP2004-363199A

DISCLOSURE

Technical Problem

The present invention provides a substrate manufacturing method using a germanium condensation process capable of enhancing the concentration uniformity and surface roughness.

The present invention provides a substrate manufacturing method using a germanium condensation process capable of further enhancing the uniformity of Ge concentration in a vertical direction.

Technical Solution

A substrate manufacturing method according to one aspect of the present invention may comprise: providing a SOI structure having an insulation layer and a silicon layer laminated on a substrate; laminating to form a silicon germanium layer and a capping silicon layer on the SOI structure; implementing oxidation process at two or more temperatures and heat treatment process at least once during the oxidation process to form a germanium cohesion layer and a silicon dioxide layer; and removing the silicon dioxide layer.

A germanium concentration of the silicon germanium layer is from 10 at % to 40 at %.

The oxidation process is implemented in multi-step in which the temperature is lowered before the silicon germanium layer is changed to a liquid state.

The oxidation process is implemented with longer time as the temperature gets lowered.

The oxidation process and the heat treatment process are implemented in a time ratio of from 0.3:1 to 1:1.

The temperature is lowered during the heat treatment process for next oxidation process and heat treatment process.

A step of the heat treatment process is implemented at a temperature during from 50% to 90% of time and is implemented with lowering the temperature during from 10% to 50% of time.

The oxidation process is implemented with supplying an oxygen gas, and the heat treatment process is implemented with stopping the supply of the oxygen gas and with supplying an inert gas successively into a same equipment.

A germanium concentration of the germanium cohesion layer is from 30 at % to 100 at %.

The germanium concentration of the germanium cohesion layer in a vertical direction has a uniformity of from 0% to 1%.

The germanium cohesion layer has a surface roughness of from 0.1 nm to 0.7 nm.

A manufacturing method of a semiconductor device according to another aspect of the present invention comprise: providing a SOI structure having an insulation layer and a silicon layer laminated on a substrate; laminating to form a silicon germanium layer and a capping silicon layer on the SOI structure; implementing oxidation process at two or more temperatures and heat treatment process at least once during the oxidation process to form a germanium cohesion layer and a silicon dioxide layer; removing the silicon dioxide layer; patterning the germanium cohesion layer for a predetermined area of the insulation layer to be exposed; and forming a gate insulation film and a gate electrode on a predetermined area of a upper portion of the germanium cohesion layer.

The germanium concentration of the germanium cohesion layer in a vertical direction has a uniformity of from 0% to 1%.

The germanium cohesion layer has a surface roughness of from 0.1 nm to 0.7 nm.

Advantageous Effects

The present invention implements an oxidation process at a different temperature at least 2 times after forming a Si—Ge layer and a capping silicon layer on a SOI substrate, and implements a heat treatment process at least 1 time during the oxidation process to form a germanium cohesion layer.

According to the present invention, a multi-step oxidation process is implemented by which a mixture state of solid and liquid in the Si—Ge layer is prevented to enhance a surface roughness. And implementing the heat treatment process during the oxidation process induce much diffusion of Ge, which enhances a concentration uniformity in a vertical direction. Therefore, a GeOI substrate of high concentration with a uniform Ge concentration distribution and an even surface roughness can be fabricated.

BEST MODE

Figure 1:
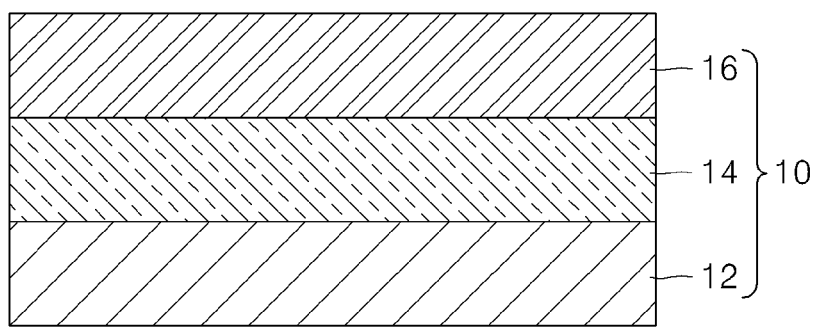
FIGS. 1 to 5 are cross-sectional views shown in sequence for a description of substrate manufacturing method according to an embodiment of the present invention.

Hereinafter, exemplary embodiments of the present invention will be described more fully with reference to the accompanying drawings. However, the present invention may be embodied in many different forms, and should not be construed as being limited to the embodiments set forth herein. Rather, these embodiments are provided so that this disclosure will be thorough and complete and will fully convey the scope of the present invention to those skilled in the art. The drawings may be exaggerated for a detailed description of the disclosure. Like reference numerals in the drawings designate like elements.

Figure 6:
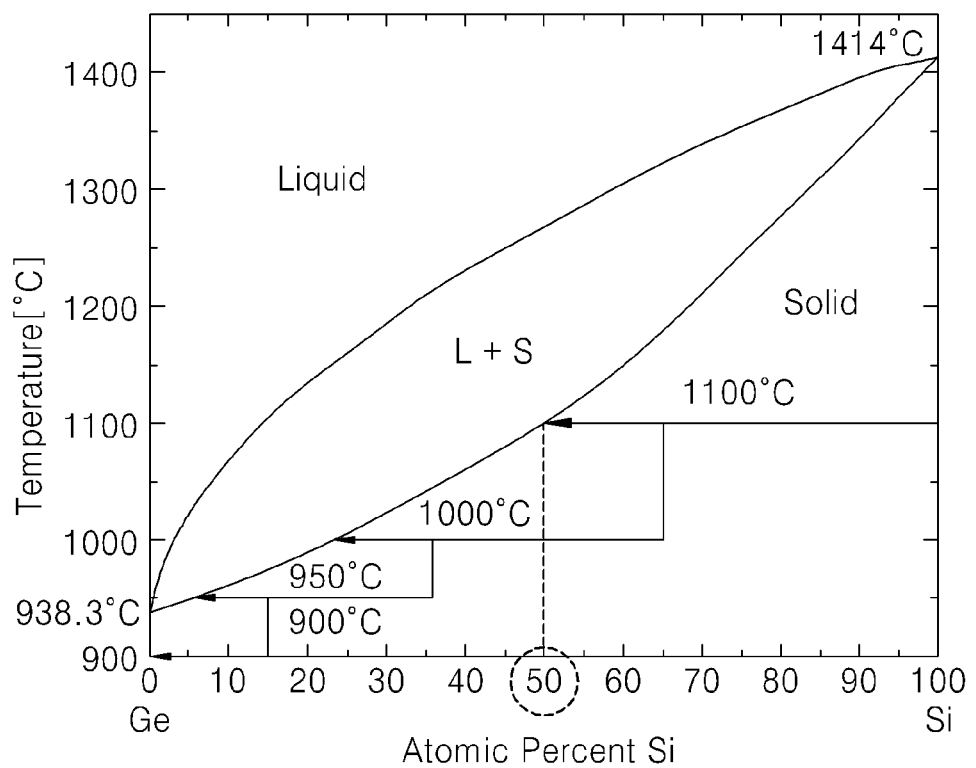
FIG. 6 shows a state diagram of Si—Ge for a description of principle of a multi-step oxidation process.
Figure 7:
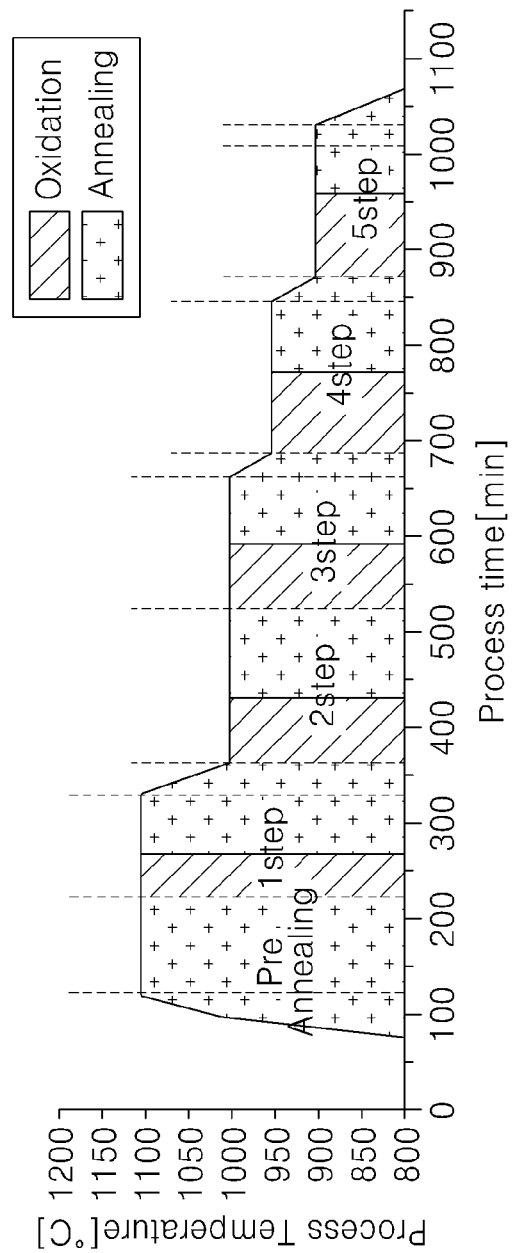
FIG. 7 shows a condition diagram of the multi-step oxidation and the heat treatment process applied to the substrate manufacturing method of the present invention.

FIGS. 1 to 5 are cross-sectional views shown in sequence for a description of substrate manufacturing method according to an embodiment of the present invention. And FIG. 6 shows a state diagram of Si—Ge for a description of principle of a multi-step oxidation process. And FIG. 7 shows a condition diagram of the multi-step oxidation and the heat treatment process applied to the substrate manufacturing method of the present invention.

Referring to FIG. 1, a silicon on insulator (SOI) structure 10 is prepared in which an insulation layer 14 and a silicon layer 16 are laminated and formed on a substrate 12. Here, the substrate 12 may be a silicon substrate, and the insulation layer 14 may be a $SiO_2$ layer. And the SOI structure 10 may be cleansed using, for example, a ultrasonic wave and then be dried. The ultrasonic wave cleansing may be implemented, for example, using acetone and methanol for 10 minutes. The silicon on insulator structure 10 completed with ultrasonic wave cleansing may be washed with deionized water and be dried at nitrogen atmosphere.

Figure 2:
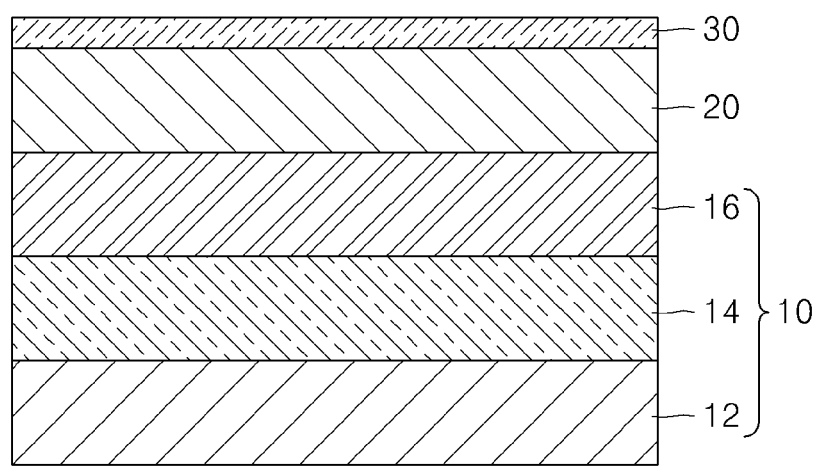

Referring to FIG. 2, a capping silicon layer 30 is formed after a silicon germanium layer 20 is formed on the SOI structure 10. The silicon germanium layer 20 and the capping silicon layer 30 may be formed successively in the same chamber. Meanwhile, before forming the silicon germanium layer 20, the SOI structure 10 may be annealed to remove a natural oxidation film and impurities on the silicon layer 16. The annealing process may be proceeded, for example, under a pressure of 0.1 Torr~1 Torr and at a hydrogen atmosphere of 700° C.~900° C. for 5 min~25 min. The silicon germanium layer 20 may be formed using a silicon source gas and a germanium source gas, for example, under a pressure of 0.1 Torr~1 Torr and at a temperature of 550° C.~750° C. for 10 min~40 min. Here, the silicon source may contain $SiH_4$, and the germanium source may contain $GeH_4$, and additional $H_2$ gas may be supplied. And when the grow temperature is less than 550° C., the silicon germanium layer 20 may not be formed, or even though formed, lots of defect may occur in the silicon germanium layer 20 grown early. On the contrary to this, when the grow temperature exceeds 750° C., lots of defect may also occur in the silicon germanium layer 20 grown early. And the germanium concentration of the silicon germanium layer 20 may be from 10 at % to 40 at %. The germanium concentration of the silicon germanium layer 20 may be selected in variety according to the thickness, germanium concentration, and so on of the germanium cohesion layer formed from the silicon germanium layer 20. Here, when the composition ratio of germanium is less than 10 at %, lots of time is required to get a germanium layer of high concentration at subsequent process, and when the composition ratio of germanium exceeds 40 at %, the silicon germanium layer 20 may not be formed since a lattice defect against the silicon layer 16 occurs. Meanwhile, since the thickness of the silicon germanium layer 20 is proportional to the thickness of germanium layer to be acquired afterwards, the silicon germanium layer 20 should be formed in an adequate thickness considering the thickness of the germanium layer to get. For example, the silicon germanium layer 20 may be formed in the thickness of 20 nm~200 nm. And a silicon is grown on the silicon germanium layer 20 to form the capping silicon layer 30. The capping silicon layer 30 functions as a diffusion barrier for cutting of the outward diffusion of germanium atom inside the silicon germanium layer 20 during the oxidation process. The capping silicon layer 30 may be formed, for example, by supplying $SiH_4$ and $H_2$ gas under a pressure of 0.1 Torr~1 Torr and at a temperature of 700° C.~900° C. for 10 sec~90 sec.

Figure 3:
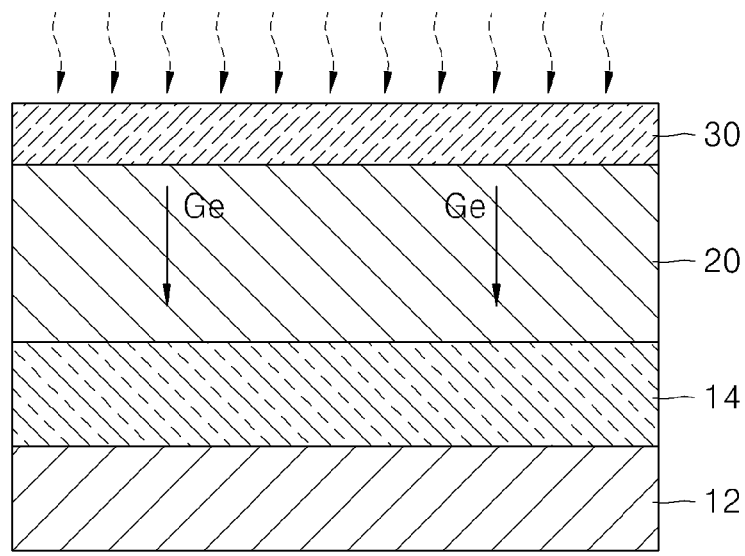

Referring to FIG. 3, at least 2 times of the multi-step oxidation process, and at least once of the heat treatment process during the oxidation process are implemented. By the oxidation process, the germanium atoms of silicon germanium layer 20 are diffused downward and the silicon atoms of silicon layer 16 are diffused upward. The oxidation and heat treatment process of the present invention may be implemented in multi-step at a temperature maintaining the silicon germanium layer 20 in a solid state. The silicon germanium layer 20 may maintain a solid state, a liquid state, and a mixture state of solid and liquid, according to the concentration and the temperature of silicon or germanium. That is to say, as shown in FIG. 6, the area inside two arcs is an area maintaining the mixture state of solid and liquid, the area upper than the arc is an area maintaining the liquid state, and the area lower than the arc is an area maintaining the solid state. In this state graph, the silicon germanium layer maintains the solid state, in the case where the silicon concentration is more than or equal to 50 at %, and it maintains the mixture state of solid and liquid, in the case where the silicon concentration is less than 50 at %, for example, at the temperature of 1100° C. And at the temperature of 1000° C., the silicon germanium layer maintains the solid state in the case where the silicon concentration is more than or equal to 25 at %, and the silicon germanium layer maintains the mixture state of solid and liquid in the case where the silicon concentration is less than 25 at %. Therefore, when the oxidation process is implemented at one temperature, for example, at 1100° C., as the silicon concentration is decreased and the germanium concentration is increased in the silicon germanium layer 20, the silicon germanium layer 20 comes to maintain the mixture state of solid and liquid. Therefore, the germanium cohesion layer formed in this state may have a problem of large surface roughness. The present invention is to solve this problem, and implements the oxidation and the heat treatment process with lowered temperature before the silicon germanium layer 20 changes to the mixture state of solid and liquid. That is to say, the present invention implements the oxidation and the heat treatment process in multi-step with lowering the temperature for the silicon germanium layer 20 to maintain the solid state even though the silicon concentration is decreased. Meanwhile, the oxidation and the heat treatment process may be implemented at the temperature of 1300° C.~900° C., which can be implemented in multi-step with lowering the temperature. For example, as shown in FIG. 7, at the temperature of 1100° C., a preliminary heat treatment process, a first oxidation process and a first heat treatment process may be implemented, at the temperature of 1000° C., a second oxidation process, a second heat treatment process, a third oxidation process and a third heat treatment process may be implemented, and then at the temperature of 950° C., a fourth oxidation process and a fourth heat treatment process may be implemented, and at the temperature of 900° C., a fifth oxidation process and a fifth heat treatment process may be implemented.

And the time of the oxidation process and the heat treatment process may be implemented at the ratio of, for example, from 0.3:1 to 1:1. For example, the oxidation process may be implemented for 30 min~100 min, and the heat treatment process may be implemented for 30 min~100 min. The process time of the oxidation process may be increased with repetition. That is to say, the time of the oxidation process may be increased as the temperature of oxidation process gets lowered. When the oxidation process is implemented long time at a high temperature, the silicon germanium layer 20 may become the mixture state of solid and liquid. Therefore, the oxidation process may be implemented during the time before it becomes such a state according to the temperature. For example, the first oxidation process may be implemented for 30 min, the second and third oxidation process may be implemented for 70 min, and the fourth and fifth oxidation process may be implemented for 100 min. Meanwhile, the heat treatment process may be implemented according to the thickness of the silicon germanium layer 20, for example, for 30 min~100 min. Here, there is a problem that the concentration uniformity of germanium in vertical direction is not enhanced because of short diffusion time of germanium when the heat treatment time is reduced. And there is another problem that the process time becomes long though there is no more germanium diffusion when the heat treatment time gets too long. These heat treatment process may be implemented for a same time for all, for example, for 100 min from the first heat treatment process to the fifth heat treatment process. Of course the heat treatment time may become shorter or longer with repetition.

Meanwhile, the temperature may be lowered to the temperature for the next oxidation process during the heat treatment process of each step. That is to say, during the first heat treatment process, temperature may be lowered for the second oxidation process and the second heat treatment process, during the third heat treatment process, temperature may be lowered for the fourth oxidation process and the fourth heat treatment process, and during the fourth heat treatment process, temperature may be lowered for the fifth oxidation and the fifth heat treatment process. The temperature adjustment as above may be implemented, for example, for 10%~50% of time of overall heat treatment time of each step. That is to say, the heat treatment process may be implemented at a temperature, for example, for 50%~90% of time of heat treatment time of each step, and then the heat treatment process may be implemented with temperature lowering for next oxidation and heat treatment for 10%~50% of time. And the adjustment speed of the heat treatment temperature may be adjusted according to the temperature and time of lowering, and it may be, for example, a speed of 2° C./min~5° C./min. For example, among 100 min of the first heat treatment process time, the heat treatment process may be implemented at the temperature of 1100° C. for 70 min and the heat treatment process may be implemented with lowering the temperature to 1000° C. for the second oxidation and the heat treatment process for 30 min.

Meanwhile, the oxidation process may be implemented with supplying a reaction gas containing oxygen, and the heat treatment process may be implemented with supplying an inert gas such as nitrogen or argon gas. That is to say, the oxidation process and the heat treatment process may be implemented at the same equipment successively by adjusting supply of oxygen and inert gas.

Figure 4:
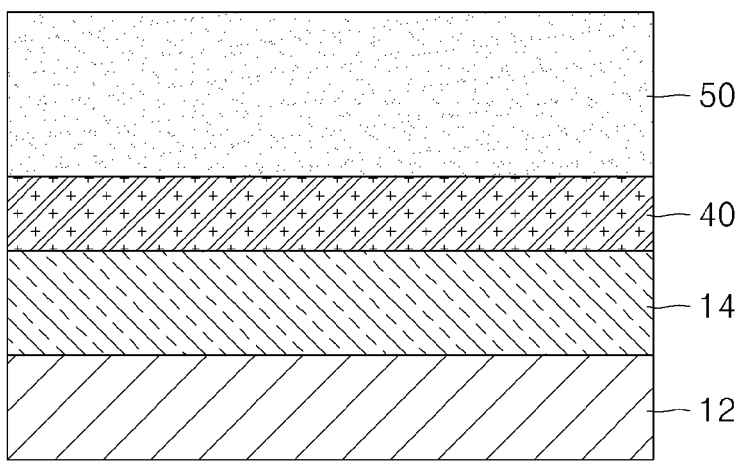

Referring to FIG. 4, the capping silicon layer 30 is oxidized to form a silicon dioxide layer 50 by the oxidation process as above and germanium atoms of the silicon germanium layer 20 are diffused downward to form a germanium condensation layer 40. And silicon atoms of silicon layer 16 and silicon germanium layer 20 are diffused upward to cause increased thickness of the silicon dioxide layer 50. Therefore, the germanium cohesion layer 40 with cohered germanium is formed on the insulation layer 14 and the silicon dioxide layer 50 is formed on the germanium cohesion layer 40. Such a germanium cohesion layer 40 has higher germanium concentration than the silicon germanium layer 20. For example, germanium cohesion layer 40 has germanium concentration of 30 at %~100 at %. Of course, the germanium cohesion layer 40 may have other silicon concentration. And the germanium cohesion layer 40 has concentration uniformity of 0%~1% in a vertical direction, and surface roughness of 0.1 nm~0.7 nm. Meanwhile, the germanium cohesion layer 40 may be formed with thinner thickness than the silicon germanium layer 20. For the germanium cohesion layer 40 formed by the multi-step oxidation process as above, the silicon germanium layer 20 does not have the mixture state of solid and liquid to enhance the surface roughness. And Ge may be much diffused by implementing the heat treatment process at least once during the multi-step oxidation process, which may enhance the concentration uniformity in a vertical direction. As a result, a germanium cohesion layer 40 may be formed whose surface roughness is enhanced and Ge concentration uniformity in a vertical direction is enhanced.

Figure 5:
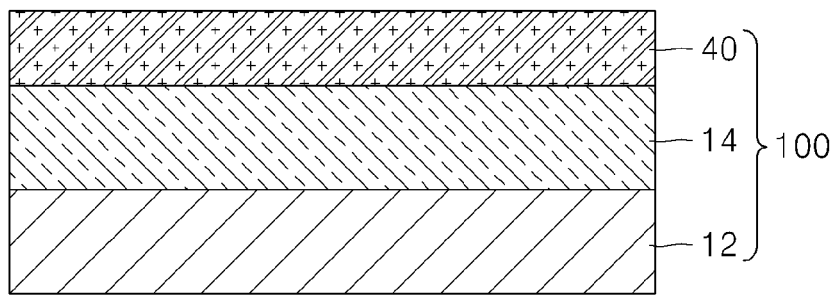

Referring to FIG. 5, a GeOI substrate 100 is formed in which the insulation layer 14 and the germanium cohesion layer 40 are formed on the substrate 12 by removing the silicon dioxide layer 50.

Embodiment

A condensation process was implemented by forming a capping silicon layer to the thickness of 10 nm after growing a Si—Ge layer with Ge concentration of 30 at % to the thickness of 100 nm on a SOI substrate formed with a silicon layer to the thickness of 17 nm. At this time, an oxidation process was implemented at the temperature of 1100° C. for 2 hours for a comparative example, while, a first oxidation process was implemented at 1100° C. for 1 hour, and then a second oxidation process was implemented with lowering the temperature to 900° C. for 2 hours for an embodiment. In the case of the comparative example implemented with oxidation process at a single temperature of 1100° C., as described using FIG. 6, the Si—Ge layer comes to have the mixture state of solid and liquid as the Ge concentration exceeds 50 at %. On the other hand, in the case of the embodiment implemented with the multi-step oxidation process, the Si—Ge layer of solid state is continually secured since the oxidation process is proceeded with lowered temperature to 900° C. before the Ge concentration of Si—Ge layer becomes the mixture state of solid and liquid.

Figure 8:
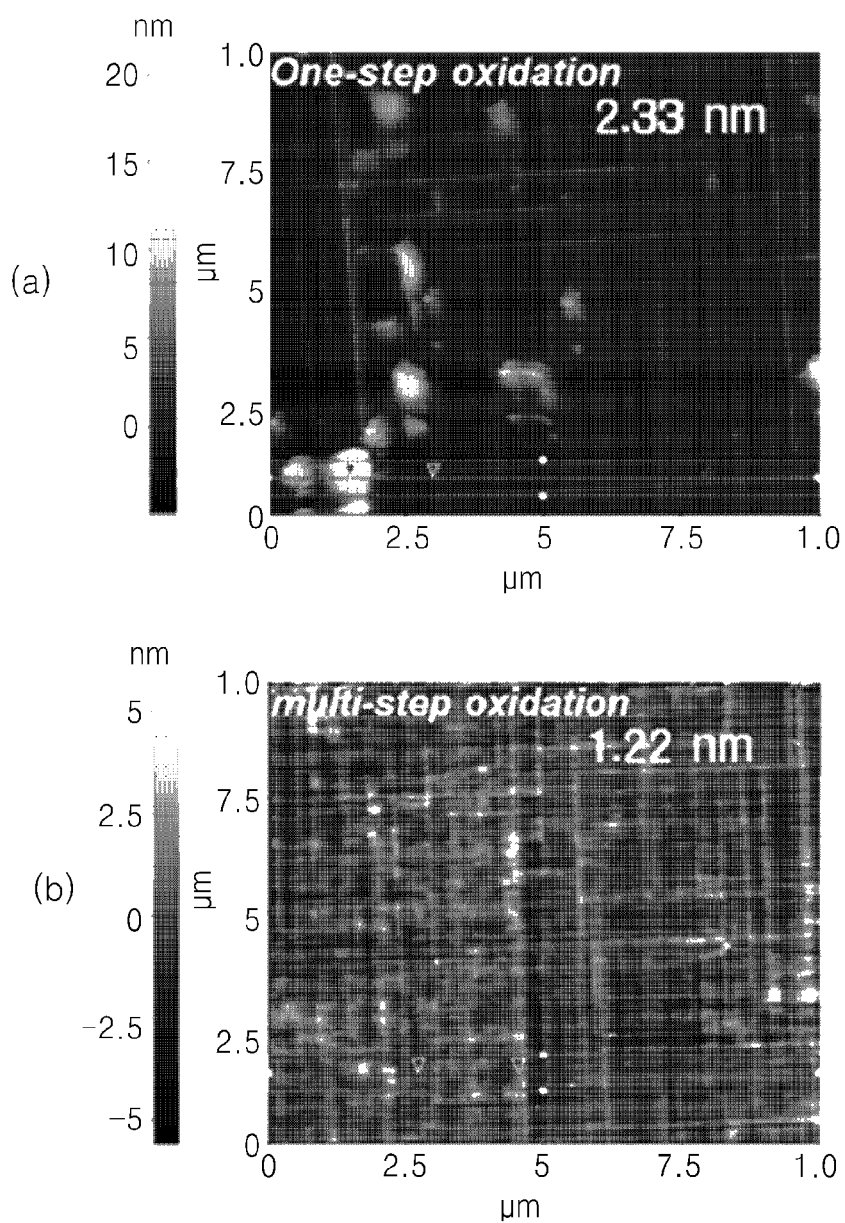
FIG. 8 shows a surface photograph after implementation of oxidation process at both a single temperature and multi-step temperatures.
Figure 9:
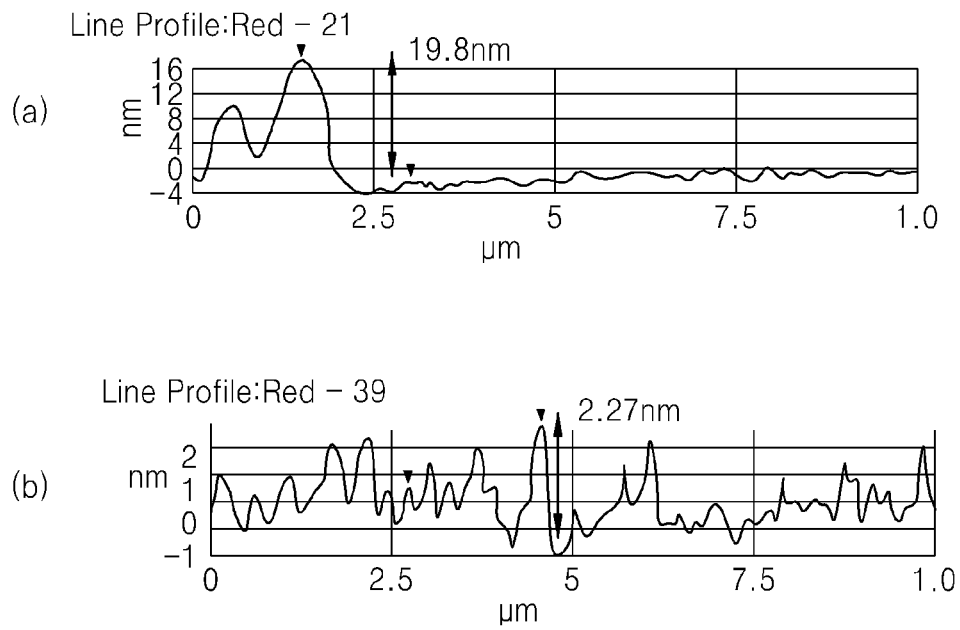
FIG. 9 shows a profile after implementation of oxidation process at both a single temperature and multi-step temperatures.

And FIG. 8 and FIG. 9 shows the surface roughness in the case of implementing the oxidation process at a single temperature and at multi-step temperatures. That is to say, FIG. 8 (a) and FIG. 8 (b) shows photographs after implementing the oxidation process at a single temperature and at multi-step temperatures each, and FIG. 9 (a) and FIG. 9 (b) shows a surface profile after implementing the oxidation process at a single temperature and at multi-step temperatures each. As shown in FIG. 8 (a), in the case of implementing the oxidation process at a single temperature, the process is proceeded at a higher temperature than the melting point as Ge concentration gets higher. This cause the liquid state and Si—Ge layer deforms to an island shape which cause the surface roughness become large. At this time, the surface roughness by the single oxidation process is about 19.8 nm as shown in FIG. 9 (a). However, when the multi-step oxidation process is implemented, the Si—Ge layer is not changed into the liquid state, and smaller surface roughness than that shown in FIG. 8 (a) is noticed as shown in FIG. 8 (b). At this time, the surface roughness by the multi-step oxidation process is about 2.27 nm as shown in FIG. 9 (b). Therefore, the decrease in the surface roughness by the multi-step oxidation process of about 9 times than that by the single oxidation process is noticed.

Figure 10:
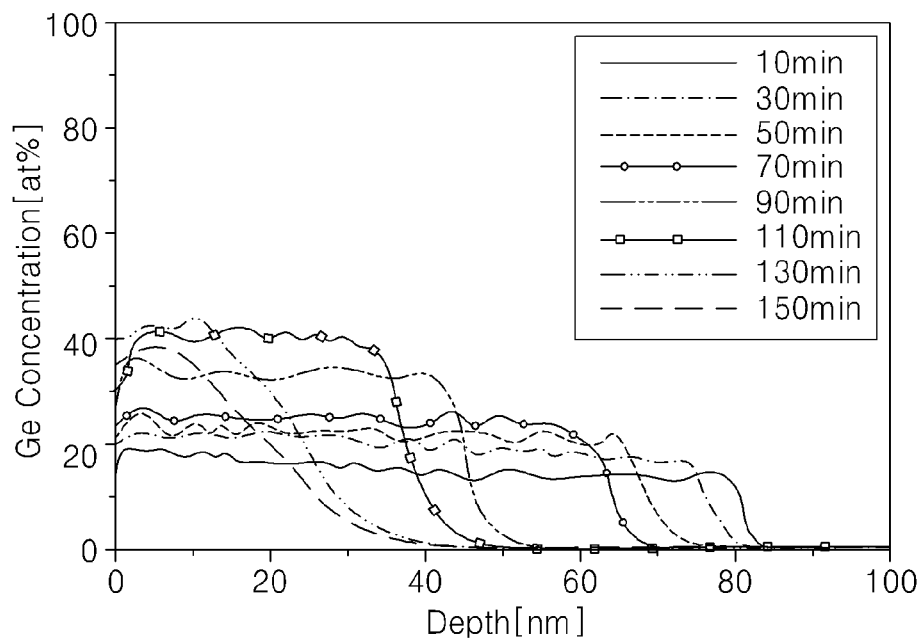
FIG. 10 shows a Ge concentration distribution graph after implementation of oxidation process at a single temperature.
Figure 11:
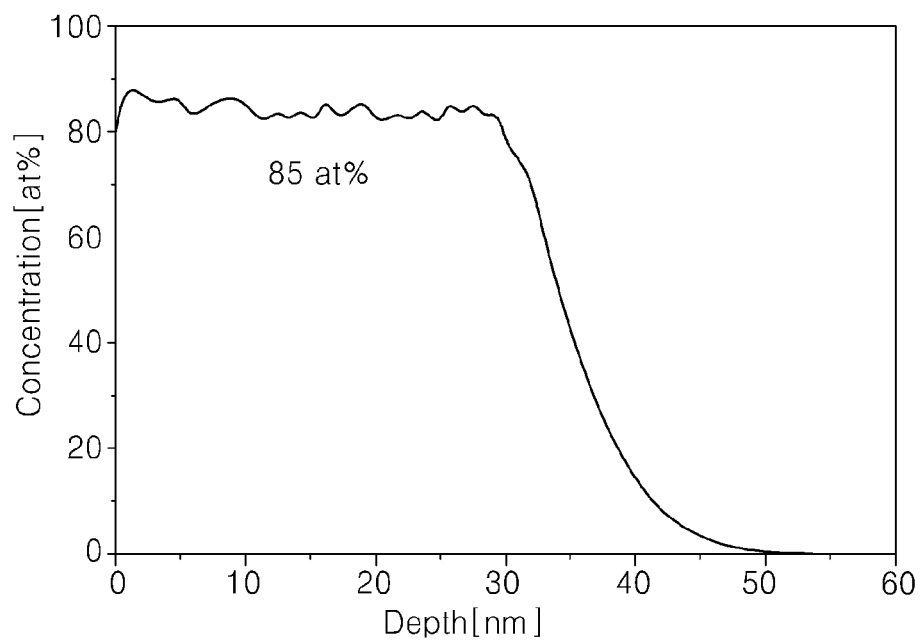
FIG. 11 shows a Ge concentration distribution graph after implementation of oxidation process at multi-step temperatures.

And FIG. 10 shows a Ge concentration according to the depth in case of implementation of oxidation process at a single temperature. FIG. 11 shows a Ge concentration according to the depth in case of implementation of oxidation process at multi-step temperatures. In case of implementation of oxidation process at a single temperature, as shown in FIG. 10, Ge concentration cannot be secured more than or equal to 50 at % because of melting despite the time adjustment of oxidation process. On the other hand, in case of implementation of multi-step oxidation process, as shown in FIG. 11, Ge concentration can be secured up to 85 at %. Therefore, when the multi-step oxidation process is applied, a GeOI substrate with large Ge concentration can be secured.

Figure 12:
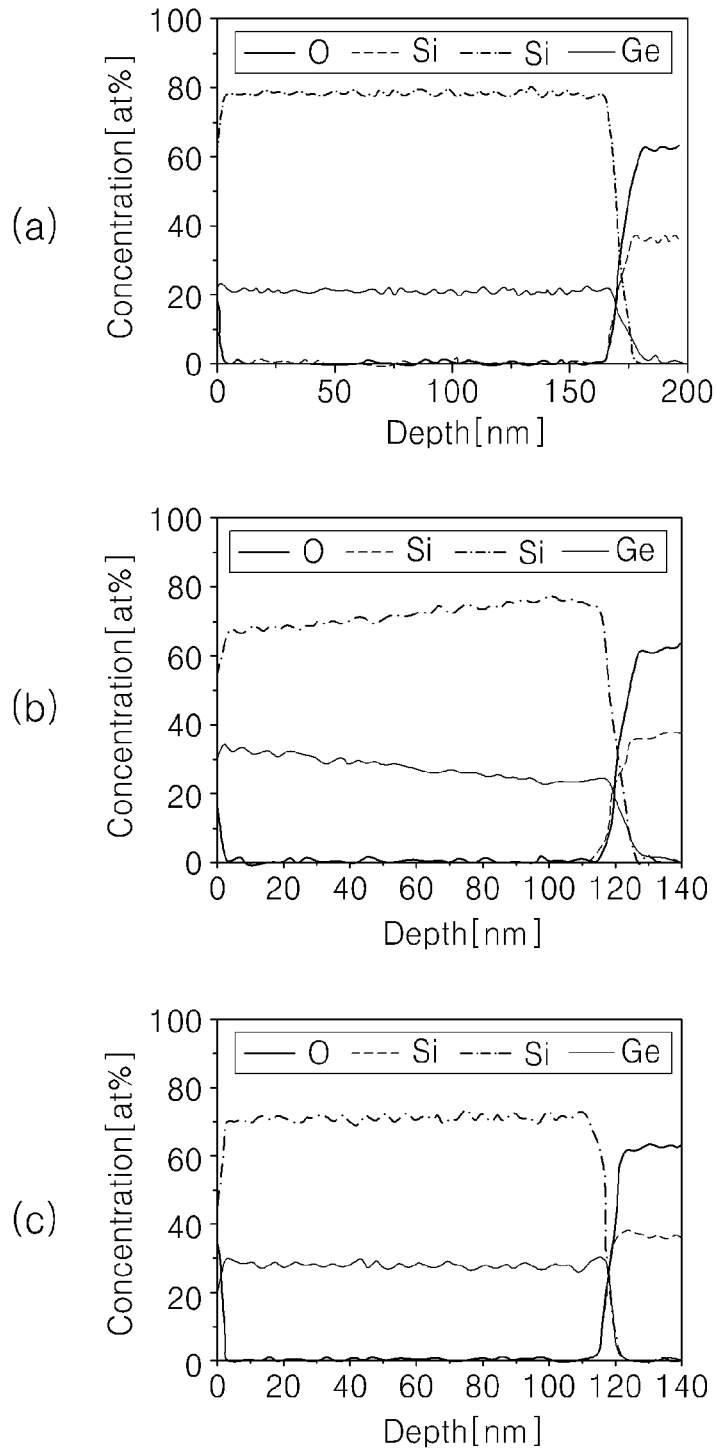
FIG. 12 shows a Ge concentration distribution graph according to presence and absence of the heat treatment process after the oxidation process.
Figure 13:
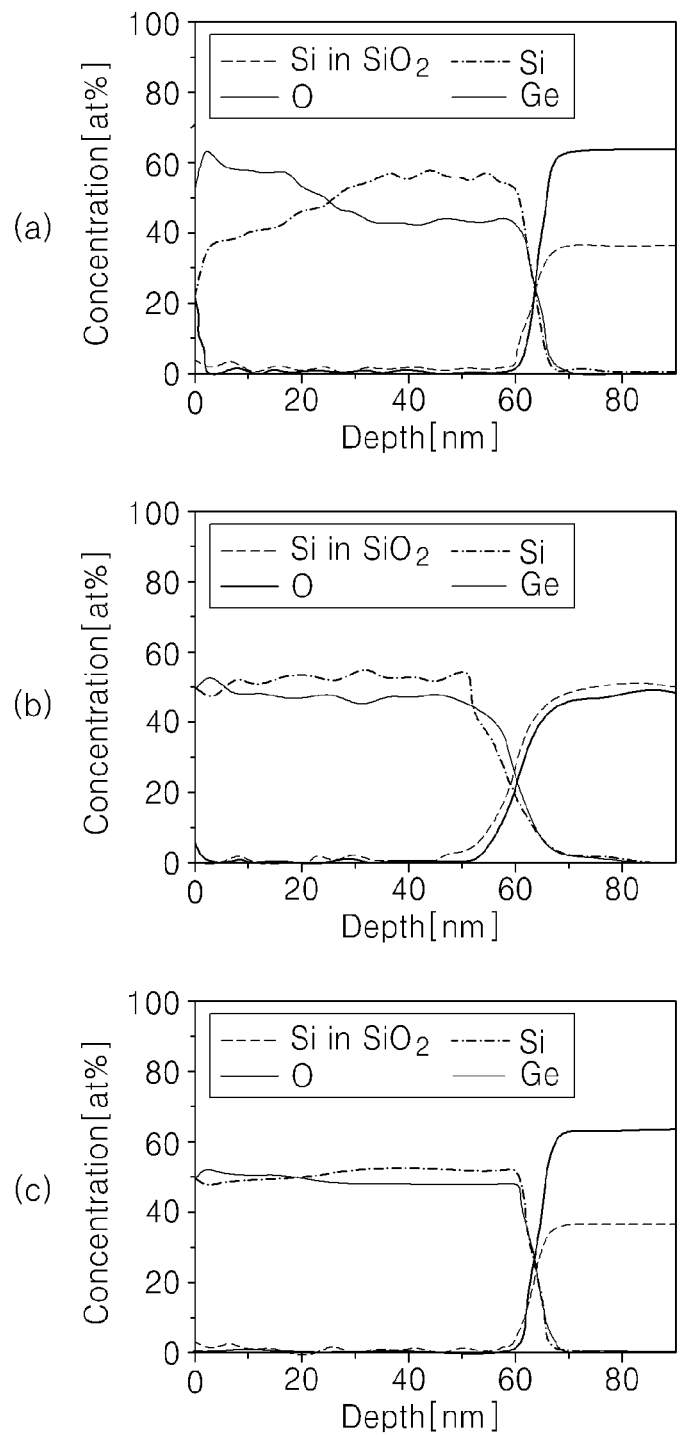
FIG. 13 shows a Ge concentration distribution graph according to the heat treatment time onto the germanium cohesion layer with Ge concentration of 50 at %.
Figure 14:
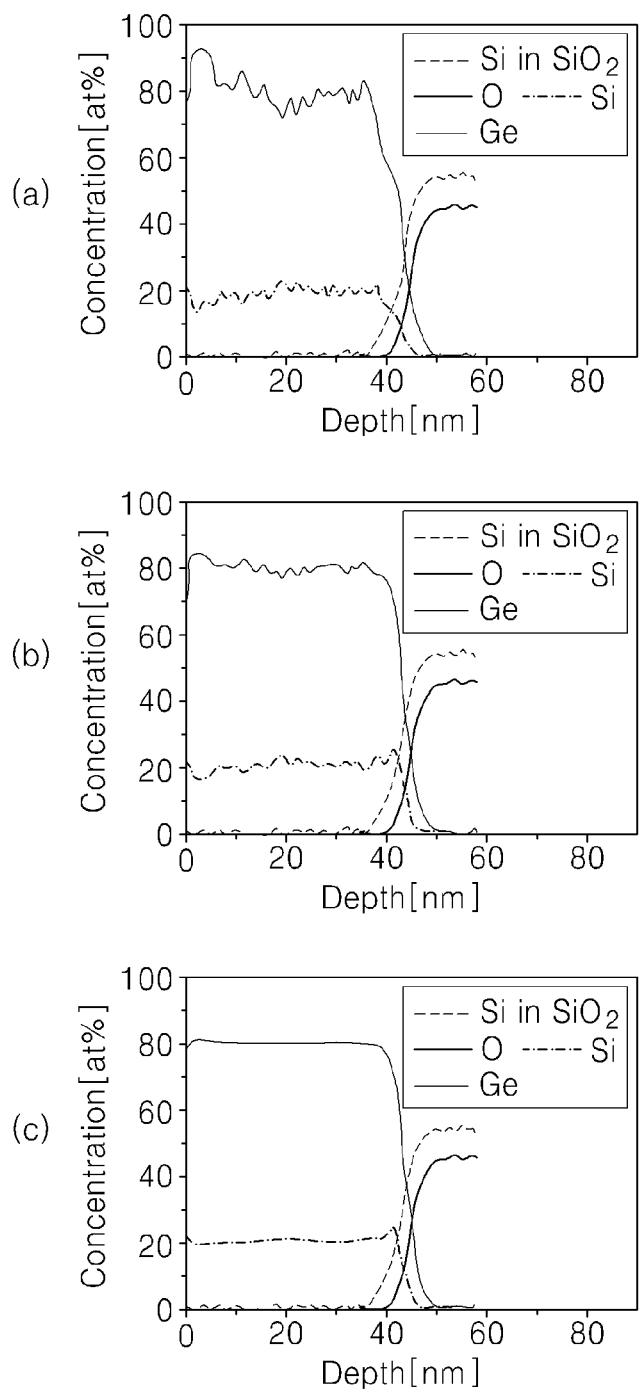
FIG. 14 shows a Ge concentration distribution graph according to the heat treatment time onto the germanium cohesion layer with Ge concentration of 80 at %.

A result checked with AES analysis of Ge concentration distribution according to the existence and absence of the heat treatment process after the oxidation process is shown in FIG. 12. That is to say, FIG. 12 (a) shows a Ge concentration distribution graph of early stage before the oxidation process, FIG. 12 (b) shows a Ge concentration distribution graph after implementing the oxidation process at the temperature of 1100° C. for 60 min, and FIG. 12 (c) shows a Ge concentration distribution graph after implementing the oxidation process at the temperature of 1100° C. for 60 min and the heat treatment process for 60 min. As shown in FIG. 12 (a), Ge concentration before implementing the oxidation process maintains about 20 at %. In case that only the oxidation process is implemented, as shown in FIG. 12 (b), Ge concentration of about 35 at % higher than that of FIG. 12 (a) is maintained. However, it can be noted that Ge concentration is gradually declining from surface in depth direction with a slope. Contrarily, in case of implementation of the oxidation process and the heat treatment process, as shown in FIG. 12 (c), it can be noted that Ge concentration of about 35% is maintained and evenly distributed from surface in depth direction. The difference of Ge concentration distribution of the Si—Ge layer when treated by subsequent heat treatment of 60 min has concentration uniformity of within 1% from surface of upper portion to lower portion And to check the concentration uniformity at the germanium cohesion layer with Ge of high concentration, an experiment is performed with different heat treatment time, in case that the Ge concentration is more than or equal to 50 at %. That is to say, FIG. 13 shows a Ge concentration distribution graph according to heat treatment time, in case that Ge concentration of germanium cohesion layer is 50 at %, and FIG. 14 shows a Ge concentration distribution graph according to heat treatment time, in case that Ge concentration of germanium cohesion layer is 80 at %. As shown in FIG. 13 (a), in case that the heat treatment process is not implemented after forming the germanium cohesion layer containing Ge of 50 at %, Ge concentration is reduced as it goes from surface of about 60 at % to lower portion to show a large concentration uniformity of the upper portion and the lower portion as about 18%. However, in case that the heat treatment process is implemented at 1000° C. for 30 min, as shown in FIG. 13 (b), Ge concentration uniformity is enhanced by about 5%, and in case that the heat treatment process is implemented at 1000° C. for 60 min, as shown in FIG. 13 (c), Ge concentration uniformity is enhanced by about 1%. And, as shown in FIG. 14 (a), in case that the heat treatment process is not implemented after forming the germanium cohesion layer containing Ge of 80 at %, Ge concentration is reduced as it goes from surface of about 90 at % to lower portion to show a large concentration uniformity of the upper portion and the lower portion as about 12%. However, in case that the heat treatment process is implemented at 1000° C. for 30 min, as shown in FIG. 14 (b), Ge concentration uniformity is enhanced by about 6%, and in case that the heat treatment process is implemented at 1000° C. for 60 min, as shown in FIG. 14 (c), Ge concentration uniformity is enhanced by about 1%. Therefore, when the heat treatment time is increased after the oxidation process, the concentration uniformity can be increased even though the Ge concentration of Si—Ge is high concentration.

Figure 15:
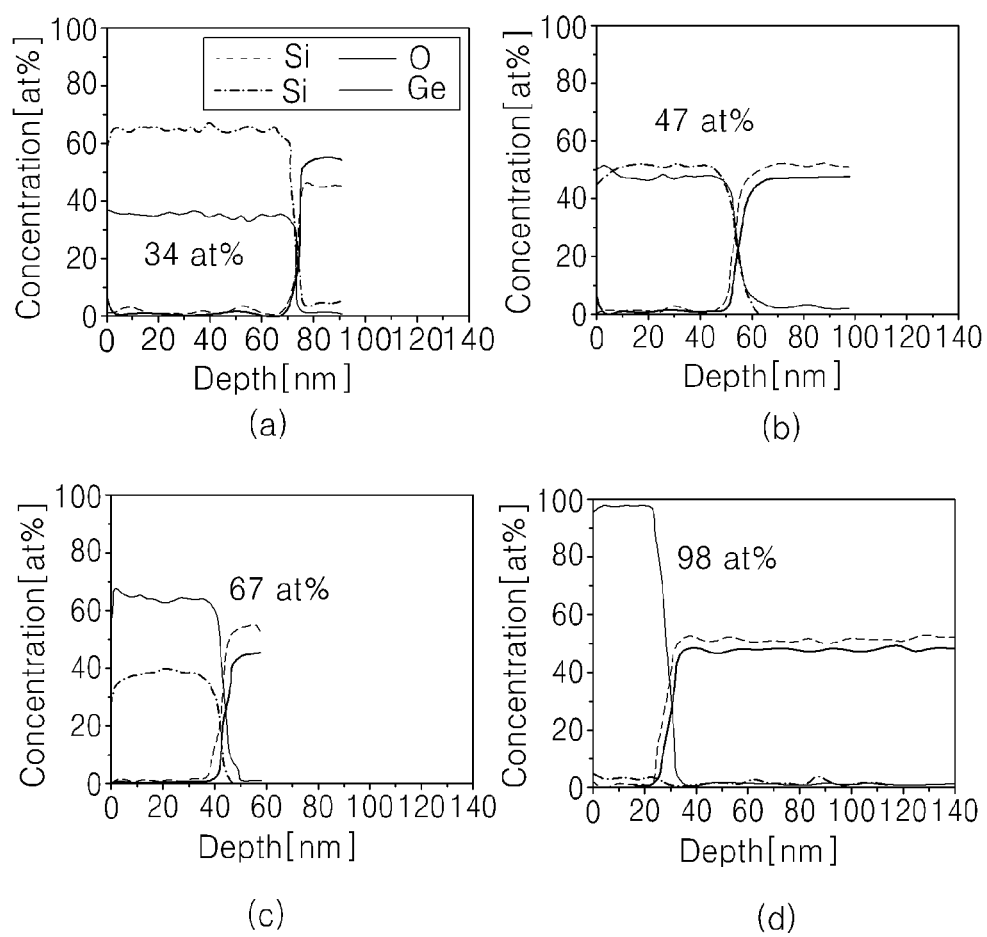
FIGS. 15 to 17 are figures showing a concentration distribution, a thickness and a surface roughness of Ge in the germanium cohesion layer after implementing the multi-step oxidation and the heat treatment process.
Figure 16:
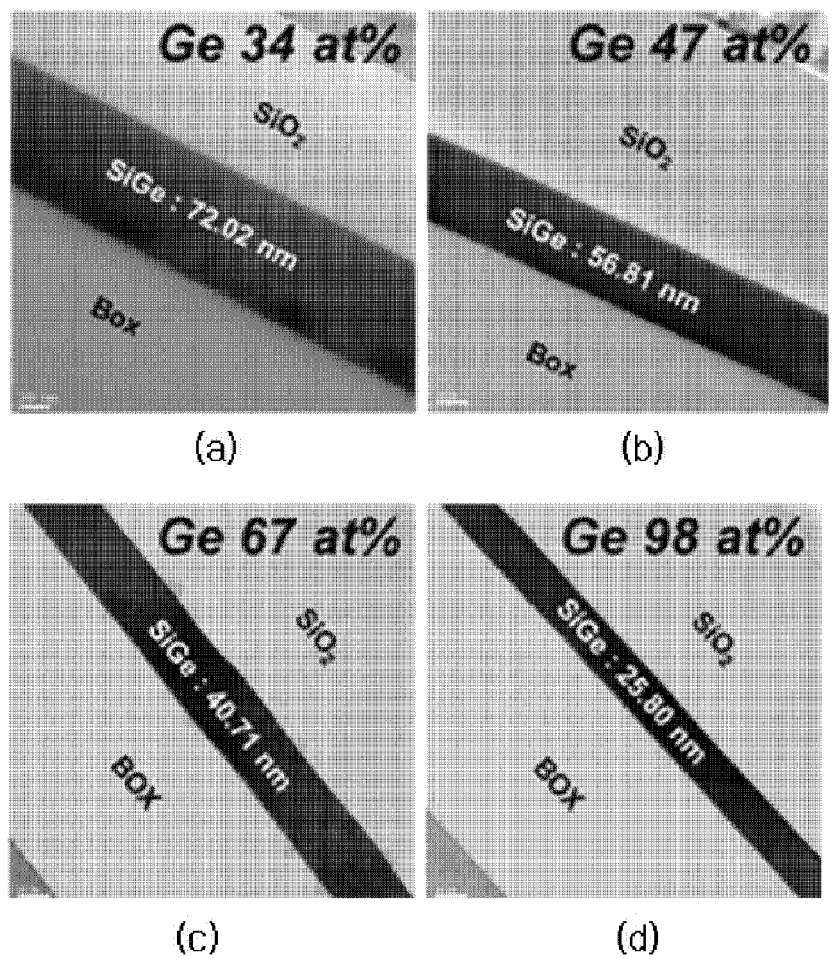
Figure 17:
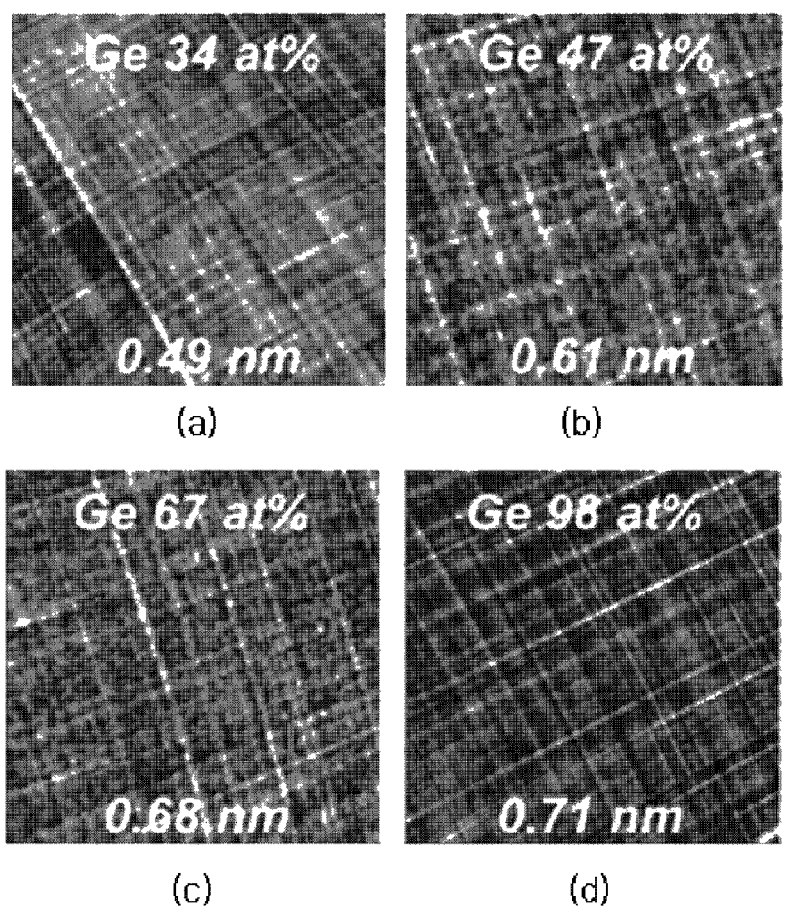

FIG. 15 to FIG. 17 shows results of analysis on the distribution, the thickness and the surface roughness of Ge concentration of the germanium cohesion layer according to Ge concentration by AES, TEM, and AFM each, after implementation of the multi-step oxidation and the heat treatment process. FIG. 15 shows a result of AES analysis on Ge concentration distribution of the germanium cohesion layer after forming the germanium cohesion layer with Ge concentration of 34 at %, 47 at %, 67 at % and 98 at % each, and then implementing the multi-step oxidation and the heat treatment process. As shown in FIG. 15 (a), when the Ge concentration is 34 at %, the germanium cohesion layer shows a distribution of Ge with almost even concentration to the depth of about 80 nm from surface, and as shown in FIG. 15 (b), when the Ge concentration is 47 at %, the germanium cohesion layer shows a distribution of Ge with almost even concentration to the depth of about 50 nm from surface. And as shown in FIG. 15 (c), when the Ge concentration is 67 at %, the germanium cohesion layer shows a distribution of Ge with almost even concentration to the depth of about 40 nm from surface, and as shown in FIG. 15 (d), when the Ge concentration is 98 at %, the germanium cohesion layer shows a distribution of Ge with almost even concentration to the depth of about 20 nm from surface. And FIG. 16 shows a TEM photograph of the germanium cohesion layer after forming the germanium cohesion layer with Ge concentration of 34 at %, 47 at %, 67 at % and 98 at % each, and then implementing the multi-step oxidation and the heat treatment process. At this time, the germanium cohesion layer is denoted as Si—Ge since it may contain germanium atoms and silicon atoms. As shown in FIG. 16 (a), when Ge concentration is 34 at %, a germanium cohesion layer with thickness of about 72.02 nm is formed, as shown in FIG. 16 (b), when Ge concentration is 47 at %, a germanium cohesion layer with thickness of about 58.81 nm is formed, as shown in FIG. 16 (c), when Ge concentration is 67 at %, a germanium cohesion layer with thickness of about 40.71 nm is formed, and as shown in FIG. 16 (d), when Ge concentration is 98 at %, a germanium cohesion layer with thickness of about 25.85 nm is formed. And FIG. 17 shows a AFM photograph of analysis of surface roughness of the germanium cohesion layer after forming the germanium cohesion layer with Ge concentration of 34 at %, 47 at %, 67 at % and 98 at % each, and then implementing the multi-step oxidation and the heat treatment process. As shown in FIG. 17 (a), when Ge concentration is 34 at %, the surface roughness is about 0.49 nm, when Ge concentration is 47 at %, the surface roughness is about 0.61 nm, when Ge concentration is 67 at %, the surface roughness is about 0.68 nm, and when Ge concentration is 98 at %, the surface roughness is about 0.71 nm.

As described above, Ge of high concentration can be secured through the multi-step oxidation process and even Ge concentration can be secured through the heat treatment process during the oxidation process. And when a GeOI having concentration uniformity of within 1% in a vertical direction and Ge concentration of 98 at % through the multi-step process using a capping silicon layer is secured, very low result of surface roughness of 0.71 nm is obtained. Therefore, Ge concentration of the silicon germanium layer can be selected according to depth, thickness, surface roughness, and so on of wanted Ge concentration distribution of the germanium cohesion layer.

Figure 18:
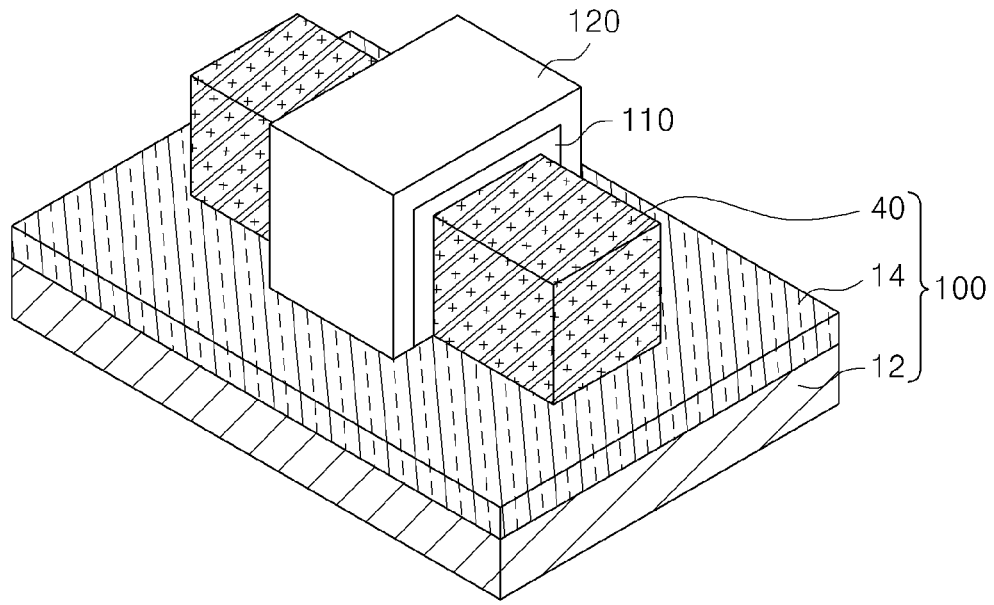
FIGS. 18 and 19 are schematic views of FinFET formed on the GeOI substrate manufactured according to an embodiment of the present invention.
Figure 19:
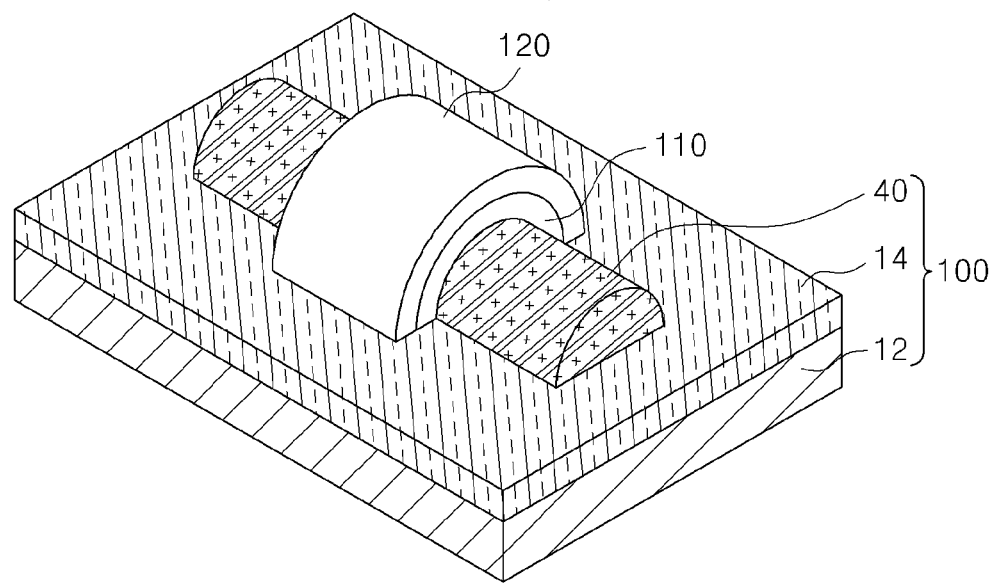

The GeOI substrate manufactured by one embodiment of the present invention is applied to a semiconductor device of the FinFET structure as shown in FIG. 18 and FIG. 19. That is to say, the germanium cohesion layer 40 is patterned as rectangular shape as shown in FIG. 18 from a GeOI structure 100 with lamination of the substrate 12, the insulation layer 14 and the germanium cohesion layer 40, and a gate insulation film 110 and a gate electrode 120 may be formed in a way to enclose a predetermined area of the patterned germanium cohesion layer 40. And as shown in FIG. 19, the germanium cohesion layer 40 may be patterned as round shape. Here, the germanium cohesion layer 40 portion of both side of the gate electrode 120 functions as source/drain.

Figure 20:
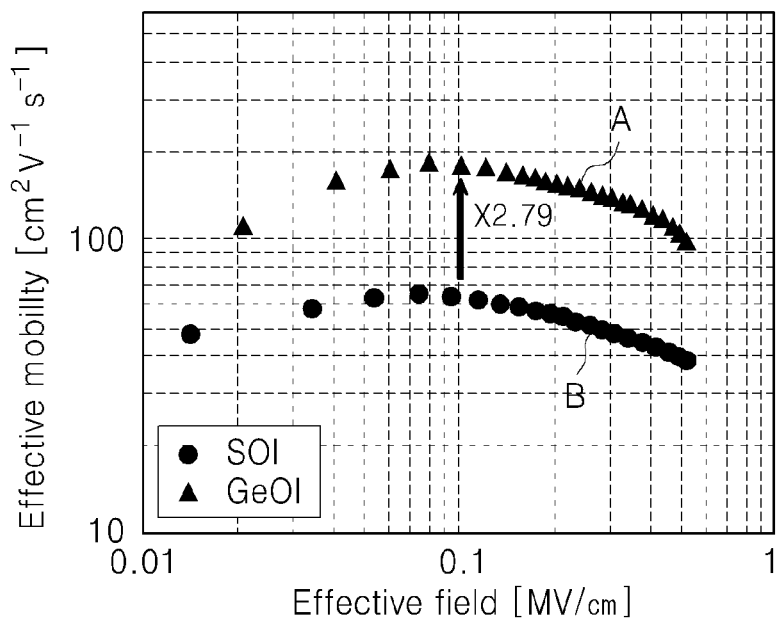
FIG. 20 shows a graph comparing effective hole mobility of a FinFET formed on a GeOI substrate fabricated according to the present invention and a FinFET formed on SOI substrate.
Figure 21:
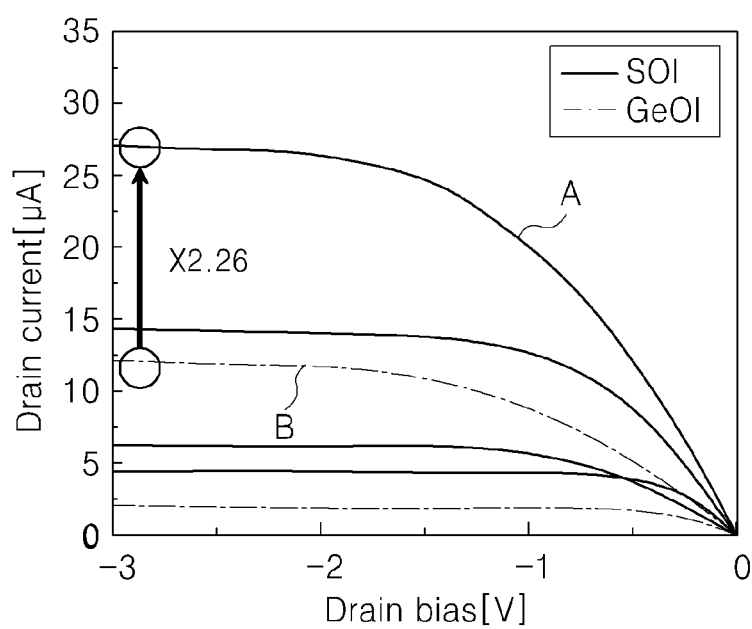
FIG. 21 shows a graph comparing the saturation current of a FinFET formed on a GeOI substrate fabricated according to the present invention and a FinFET formed on SOI substrate.

The FinFET formed on the GeOI substrate fabricated by the multi-step oxidation and the heat treatment process of the present invention as above can enhance the device characteristic than a FinFET formed on a SOI substrate. That is to say, FIG. 20 shows a graph comparing the effective hole mobility of the FinFET (A) formed on a GeOI substrate fabricated according to the present invention to the effective hole mobility of the FinFET (B) formed on a SOI substrate, and the effective hole mobility of FinFET (A) formed on the GeOI substrate is enhanced by more than or equal to 2.79 times compared to that of FinFET (B) formed on the SOI substrate as shown. And FIG. 21 shows a graph comparing the saturation current of the FinFET (A) formed on the GeOI substrate fabricated according to the present invention to the saturation current of a FinFET (B) formed on a SOI substrate, and the saturation current of the FinFET formed on the GeOI substrate is enhanced by more than or equal to 2.26 times compared to that of the FinFET formed on the SOI substrate as shown.

The present invention is not limited to the disclosed embodiments, but, on the contrary, may be embodied in variety of different ways. That is to say, exemplary embodiments introduced herein are provided to make disclosed contents thorough and complete and to sufficiently the spirit of the present invention to those skilled in the art. The scope of the present invention will only be defined by the appended claims.

What is claimed is:

1. A substrate manufacturing method, comprising:
   providing a SOI structure having an insulation layer and a silicon layer laminated on a substrate;
   laminating to form a silicon germanium layer and a capping silicon layer on the SOI structure;
   implementing oxidation process at two or more temperatures and heat treatment process at least once during the oxidation process to form a germanium cohesion layer and a silicon dioxide layer; and
   removing the silicon dioxide layer.

2. The substrate manufacturing method according to claim 1, wherein a germanium concentration of the silicon germanium layer is from 10 at % to 40 at %.

3. The substrate manufacturing method according to claim 1, wherein the oxidation process is implemented in multi-step in which the temperature is lowered before the silicon germanium layer is changed to a liquid state.

4. The substrate manufacturing method according to claim 3, wherein the oxidation process is implemented with longer time as the temperature gets lowered.

5. The substrate manufacturing method according to claim 1, wherein the oxidation process and the heat treatment process are implemented in a time ratio of from 0.3:1 to 1:1.

6. The substrate manufacturing method according to claim 5, wherein the temperature is lowered during the heat treatment process for next oxidation process and heat treatment process.

7. The substrate manufacturing method according to claim 6, wherein a step of the heat treatment process is implemented at a temperature during from 50% to 90% of time and is implemented with lowering the temperature during from 10% to 50% of time.

8. The substrate manufacturing method according to claim 1, wherein the oxidation process is implemented with supplying an oxygen gas, and the heat treatment process is implemented with stopping the supply of the oxygen gas and with supplying an inert gas successively into a same equipment.

9. The substrate manufacturing method according to claim 1, wherein a germanium concentration of the germanium cohesion layer is from 30 at % to 100 at %.

10. The substrate manufacturing method according to claim 9, wherein the germanium concentration of the germanium cohesion layer in a vertical direction has a uniformity of from 0% to 1%.

11. The substrate manufacturing method according to claim 10, wherein the germanium cohesion layer has a surface roughness of from 0.1 nm to 0.7 nm.

12. A manufacturing method of a semiconductor device, comprising:
    providing a SOI structure having an insulation layer and a silicon layer laminated on a substrate;
    laminating to form a silicon germanium layer and a capping silicon layer on the SOI structure;
    implementing oxidation process at two or more temperatures and heat treatment process at least once during the oxidation process to form a germanium cohesion layer and a silicon dioxide layer;
    removing the silicon dioxide layer;
    patterning the germanium cohesion layer for a predetermined area of the insulation layer to be exposed; and
    forming a gate insulation film and a gate electrode on a predetermined area of a upper portion of the germanium cohesion layer.

13. The manufacturing method of a semiconductor device according to claim 12, wherein the germanium concentration of the germanium cohesion layer in a vertical direction has a uniformity of from 0% to 1%.

14. The manufacturing method of a semiconductor device according to claim 13, wherein the germanium cohesion layer has a surface roughness of from 0.1 nm to 0.7 nm.

* * * * *